(12) United States Patent
Sun et al.

(10) Patent No.: US 7,764,127 B2
(45) Date of Patent: Jul. 27, 2010

(54) HIGH RESOLUTION DIGITALLY CONTROLLED OSCILLATOR

(75) Inventors: Bo Sun, Carlsbad, CA (US); Arun Jayaraman, San Diego, CA (US); Gary John Ballantyne, Christchurch (NZ); Gurkanwal S Sahota, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 11/565,523

(22) Filed: Nov. 30, 2006

(65) Prior Publication Data

US 2008/0129398 A1 Jun. 5, 2008

(51) Int. Cl.
*H03B 5/12* (2006.01)
(52) U.S. Cl. .................... 331/36 C; 331/117 FE; 331/179; 336/69
(58) Field of Classification Search ............... 331/36 C, 331/179, 117 R, 117 FE, 167
See application file for complete search history.

(56) References Cited

U.S. PATENT DOCUMENTS 7,116,183 B2 * 10/2006 Wu ....................... 331/117 FE
7,154,349 B2 * 12/2006 Cabanillas ............... 331/117 R
7,230,504 B1 * 6/2007 Marques et al. ........ 331/117 FE
7,280,001 B2 * 10/2007 Maligeorgos et al. ....... 331/158
7,518,458 B2 * 4/2009 Nakamura et al. .......... 331/167

FOREIGN PATENT DOCUMENTS

| DE | 011285 | 9/2007 |
| EP | 899866 | 3/1999 |
| WO | 0152401 | 7/2001 |
| WO | 2004068697 | 8/2004 |

OTHER PUBLICATIONS

International Search Report—PCT/US2007/085541, International Search Authority, European Patent Office—Mar. 14, 2008.

\* cited by examiner

*Primary Examiner*—Robert Pascal
*Assistant Examiner*—James E Goodley
(74) *Attorney, Agent, or Firm*—William M. Hooks

(57) ABSTRACT

This disclosure describes designs for a digitally controlled oscillator (DCO). The DCO can overcome many of the shortcomings associated with conventional voltage controlled oscillators (VCOs), and may improve wireless communication devices. The described DCO may improve the frequency synthesis process, reduce noise in a wireless communication device, and allow for simplification of various components of the device.

35 Claims, 10 Drawing Sheets

HIGH RESOLUTION DIGITALLY CONTROLLED OSCILLATOR

FIELD

This disclosure relates to oscillators that can be implemented within wireless communication devices, and more particularly digitally controlled oscillators (DCO's).

BACKGROUND

Oscillators are commonly implemented within wireless communication devices that transmit and receive wireless signals. For example, an oscillator is commonly used within a frequency synthesizer in a wireless communication device to generate carrier waveforms. Baseband signals are modulated on the carrier waveforms, and then the modulated carrier waveforms are transmitted to other devices as wireless signals. The receiving device uses an oscillator to synthesize the carrier and remove the baseband signal for demodulation. Oscillators are of paramount importance to wireless communication. Oscillators are also used in many other applications, including wired communication applications.

Conventional oscillators typically use a varactor that is controlled via a phase-locked loop (PLL). Unfortunately, such voltage controlled oscillator (VCO) designs require the use of analog circuitry or components, which are often undesirable. Furthermore, it is very difficult to improve the performance of VCOs, e.g., due to difficulties in reducing supply voltages and complexities associated with the charge-pump and analog filter. For these reasons, digitally controlled oscillators (DCOs) have been developed for some applications.

SUMMARY

In general, this disclosure describes various embodiments of a digitally controlled oscillator (DCO). A DCO configured according to this disclosure can overcome many of the shortcomings associated with conventional voltage controlled oscillators (VCOs), and may improve frequency synthesis performance in a wireless communication device. The described DCO may also reduce noise in a wireless communication device, and allow for simplification of various components of the wireless communication device.

In one embodiment, this disclosure provides a DCO comprising an inductor-capacitor circuit that generates an oscillating output. The inductor-capacitor circuit includes a coarse digital tuning unit that coarsely tunes the oscillating output, and a fine digital tuning unit that finely tunes the oscillating output. The fine digital tuning unit includes fine tuning elements and each of the fine tuning elements comprises plate capacitors and at least three transistors between the plate capacitors.

In another embodiment, this disclosure provides a method comprising adjusting an oscillating output of an inductor-capacitor circuit via a coarse digital tuning unit to provide coarse tuning of the oscillating output, and adjusting the oscillating output of the inductor-capacitor circuit via a fine digital tuning unit to provide fine digital tuning of the oscillating output, wherein the fine digital tuning unit includes fine tuning elements and wherein each of the fine tuning elements comprises plate capacitors and at least three transistors between the plate capacitors.

In another embodiment, this disclosure provides a wireless communication device comprising a modem that modulates or demodulates baseband signals, a mixer that mixes or de-mixes the baseband signals with a carrier waveform, and a frequency synthesizer that generates the carrier waveform. The frequency synthesizer includes a DCO comprising an inductor-capacitor circuit that generates an oscillating output, wherein the inductor-capacitor circuit includes a coarse digital tuning unit that coarsely tunes the oscillating output, and a fine digital tuning unit that finely tunes the oscillating output, wherein the fine digital tuning unit includes fine tuning elements and wherein each of the fine tuning elements comprises plate capacitors and at least three transistors between the plate capacitors.

In an added embodiment, this disclosure provides a DCO comprising an inductor-capacitor circuit that generates an oscillating output, wherein the inductor-capacitor circuit includes a coarse digital tuning unit that coarsely tunes the oscillating output, and a fine digital tuning unit that finely tunes the oscillating output, wherein the fine digital tuning unit includes fine tuning elements and wherein each of the fine tuning elements comprises plate capacitors and one or more switches between the plate capacitors. In this case, the switches may comprise one or more transistors and/or one or more microelectromechanical (MEM) switches.

Additional details of various embodiments are set forth in the accompanying drawings and the description below. Other features, objects and advantages will become apparent from the description and drawings, and from the claims.

DETAILED DESCRIPTION

Figure 1:
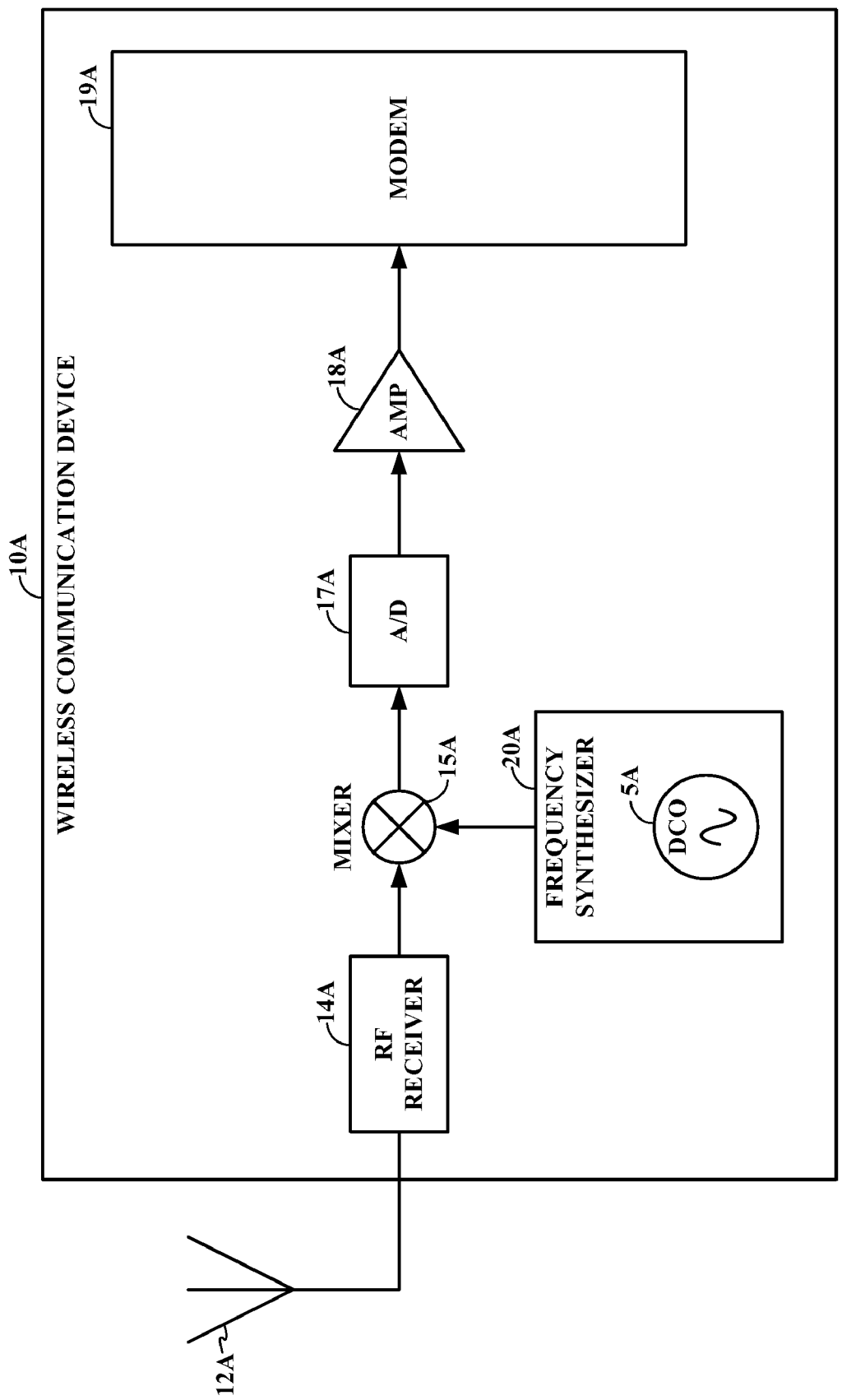
FIG. 1 is a block diagram of a wireless communication device illustrating components used during wireless signal reception, including a frequency synthesizer that may implement a digitally controlled oscillator (DCO) according to this disclosure.
Figure 2:
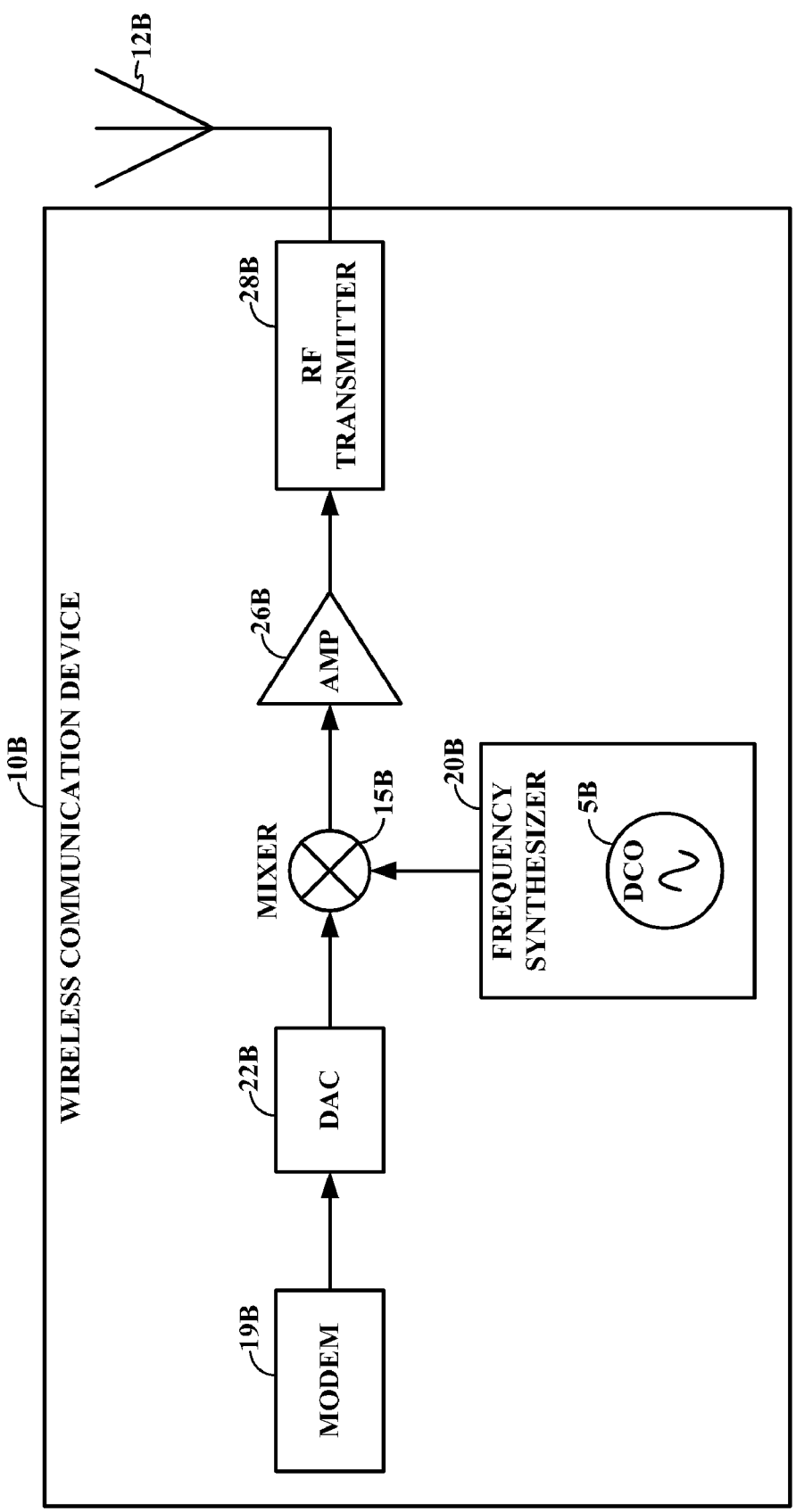
FIG. 2 is a block diagram of a wireless communication device illustrating components used during wireless signal transmission, including a frequency synthesizer that may implement a DCO according to this disclosure.

FIGS. 1 and 2 are block diagrams of wireless communication devices 10A and 10B implementing frequency synthesizers 20A and 20B for mixing associated with wireless signal reception and wireless signal transmission, respectively.

In either case, the respective frequency synthesizer 20A or 20B may implement one or more of the oscillator designs described in this disclosure to improve operation of the wireless communication device 10A or 10B. In particular, frequency synthesizers 20A and 20B make use of a digitally controlled oscillator (DCO) 5A, 5B as described herein, which may eliminate one or more analog components such as the charge-pump, loop filters, and associated analog phase-locked loop (PLL) common for conventional voltage controlled oscillators (VCOs).

DCOs 5A and 5B each comprise an inductor-capacitor circuit (sometimes called an "LC" tank) that generates an oscillating output. According to this disclosure, the inductor-capacitor circuit of DCOs 5A and 5B comprise a coarse digital tuning unit that coarsely tunes the oscillating output, and a fine digital tuning unit that finely tunes of the oscillating output. The fine digital tuning unit includes fine tuning elements and each of the fine tuning elements comprises plate capacitors and at least three transistors between the plate capacitors. For example, the fine digital tuning unit may comprise a first plate capacitor, a second plate capacitor, a first transistor that couples the first plate capacitor to the second plate capacitor, a second transistor that couples the first plate capacitor to ground and a third transistor that couples the second plate capacitor to ground.

A variety of more specific features of DCOs are also described in greater detail below. In any case, devices 10A and 10B are merely exemplary devices that can utilize the DCOs described herein. Many other types of devices could also benefit from the teaching of this disclosure, including other types of wireless communication devices, or more generally, any wireless or wired device that uses an oscillator.

The wireless communication device (WCD) 10A of FIG. 1 implements a so-called "Zero IF" architecture, although this disclosure is not limited in this respect. In Zero-IF architectures, WCD 10A converts incoming signals directly into baseband signals and, specifically, does not first convert the received signals to intermediate frequency (IF) signals.

WCD 10A includes antenna 12A that receives incoming wireless signals. By way of example, the incoming wireless signals may comprise code division multiple access (CDMA) modulated signals sent from a CDMA base station. GSM signals or other types of wireless signals, however, may also be supported. In the illustrated example, wireless signal received by antenna 12A can be processed by RF receiver 14A, such as by passing the signal through low-noise amplifier (LNA) and one or more filters. The wireless signal is then mixed down to baseband by mixer 15A (sometime called a "down-mixer" or "de-mixer"). Mixer 15A may receive reference waveforms produced by frequency synthesizer 20A. According to this disclosure, frequency synthesizer 20A may implement a DCO as outlined in greater detail below to generate an oscillating frequency. Again, the described DCO may improve the frequency synthesis process, possibly reduce noise in the system, and allow for simplification of various components of frequency synthesizer 20A and device 10A.

Mixer 15A produces baseband signals which can be filtered and sampled by analog-to-digital (A/D) converter 17A to produce corresponding digital samples of the signals. One or more amplifiers 18A, such as a digital voltage gain amplifier (VGA), can be used to scale the digital baseband signal, either by amplifying or attenuating the digital values according to gain values received from an automatic gain control unit (not shown).

After scaling by amplifier 18A, the scaled digital baseband signal is provided to modem 19A, which may comprise a demodulator. For CDMA application, modem 19A may include a so-called "RAKE" receiver, which separates and tracks signals received from different sources, e.g., different base stations, or signals received from the same source via multiple propagation paths, i.e. multi-path signals. For example, modem 19A may include a number of "fingers" that perform despreading, Walsh decovering and accumulation, pilot time tracking and frequency tracking. Each finger of modem 19A outputs pilot and data symbols for the corresponding path. Symbol demodulation and/or other signal processing may then be performed on the pilot and data symbols. As desired, WCD 10A may also include additional components (not shown) such as filters and various digital or analog signal processing components. Of course, for other standards or techniques, RAKE fingers may not be used, although the DCO described herein may be equally useful for such standards or techniques.

Devices 10A and 10B may implement to one or more of a wide variety of wireless communication standards or techniques. Examples of wireless communication techniques include frequency division multiple access (FDMA), time division multiple access (TDMA) and various spread spectrum techniques. One common spread spectrum technique used in wireless communication is code division multiple access (CDMA) signal modulation in which multiple communications are simultaneously transmitted over a spread spectrum signal.

Furthermore, some wireless standards make use of two or more techniques, such as GSM systems, which use a combination of TDMA and FDMA modulation. GSM stands for "Global System for Mobile Communications." A number of wireless networking standards, and other wireless communication standards and techniques have also been developed, including several IEEE 802.11 standards, Bluetooth standards, and emerging ultra-wideband (UWB) techniques and standards. All of these standards and techniques typically use oscillators in the generation and demodulation of wireless signals.

Exemplary wireless communication devices include cellular or satellite radiotelephones, radiotelephone base stations, computers that support one or more wireless networking standards, wireless access points for wireless networking, PCM-CIA cards incorporated within portable computers, direct two-way communication devices, personal digital assistants (PDAs) equipped with wireless communication capabilities, and the like. Examples of computing devices used in wireless networks, which could also benefit form the DCO designs described in this disclosure, may include laptop or desktop computers, mobile phones such as cellular radiotelephones and satellite radiotelephones, data terminals, data collection devices, PDAs and other portable and non-portable computing devices. These and many other types of devices may use oscillators that could be replaced by one of the DCO's described herein.

FIG. 2 is another block diagram of an exemplary WCD 10B, illustrating components implemented during signal transmission. In this case, modem 19B may comprise a modulator that generates and forward baseband signals to digital-to-analog converter (DAC) 22B, which generates an analog baseband signal. Frequency synthesizer 20B provides carrier waveforms to mixer 15B (sometimes called an "up-mixer"). Importantly, frequency synthesizer 20B includes a DCO 5B according to this disclosure.

Mixer 15B combines the baseband signal into the carrier and forwards the modulated carrier signal to amplifier 26B for scaling. Amplifier 26B generally represents one or more voltage gain amplifiers (VGAs), driver amplifiers (DAs), and power amplifiers (PAs). The different amplifiers may reside on the same integrated circuit chip, or multiple different chips. Once the modulated signal has been adequately amplified or attenuated, RF transmitter 28B may transmit the modulated RF signal from wireless communication device 10B via antenna 12B.

As noted, above, conventional oscillators typically use a charge-pump that is controlled via an analog PLL. Such VCO designs require the use of analog circuitry or components, which are often undesirable. Furthermore, it is very difficult to improve the performance of VCOs, e.g., due to difficulties in reducing supply voltages and complexities associated with the charge-pump analog filter.

For these and other reasons, this disclosure describes designs for a DCO, which may be used as DCO 5A or 5B of devices 10A or 10B, or may be used in other wireless communication devices or any other devices that make use of oscillators. The DCO designs described in greater detail below may overcome many of the shortcomings associated with conventional VCOs, and may improve wireless communication devices or other devices that use oscillators. In particular, the described DCO may improve the frequency synthesis process, possibly reduce noise in a wireless communication device, and allow for simplification of various components of the device.

For example, due to the nonlinearity of deep-submicron metal oxide semiconductor (MOS) varactor and lower supply voltage, it is becoming increasingly difficult to design improved VCOs. The requirement of a charge pump analog filter can compound such difficulties. Furthermore, VCO tuning is dependent on the change of equivalent capacitance on the varactor by the external control voltage.

This disclosure allows the capacitance tuning to change as discrete steps which are small enough to approximate the continuous nature of analog control. In particular, this disclosure facilitates capacitance tuning to steps less than approximately 4 kHz. As explained in greater detail below, for example, a total of 4096 fine tune units may provide 4 kHz tuning steps. The techniques of this disclosure, however, may use tuning steps that are smaller or larger than this 4 KHz example. In this manner, components involved with oscillator control can be moved to the digital domain. Advances in deep submicron processes can facilitate this opportunity to implement oscillator control digitally with resolution sufficient to accurately approximate analog control.

In conventional VCOs, digital or discrete coarse tuning is used to compensate for process variations at a targeted operating frequency. However, to achieve the resolution needed for wireless applications, analog voltage control is still typically used for fine tuning. In particular, voltage control to the varactor can provide the fine control range to compensate temperature and supply variations. This fine control needs sufficient range to cover the frequency drift due to these variations. In the DCO designs of this disclosure, however, the analog fine tuning components of conventional VCOs can be replaced with a digitally controlled switched capacitor arrays.

Figure 3:
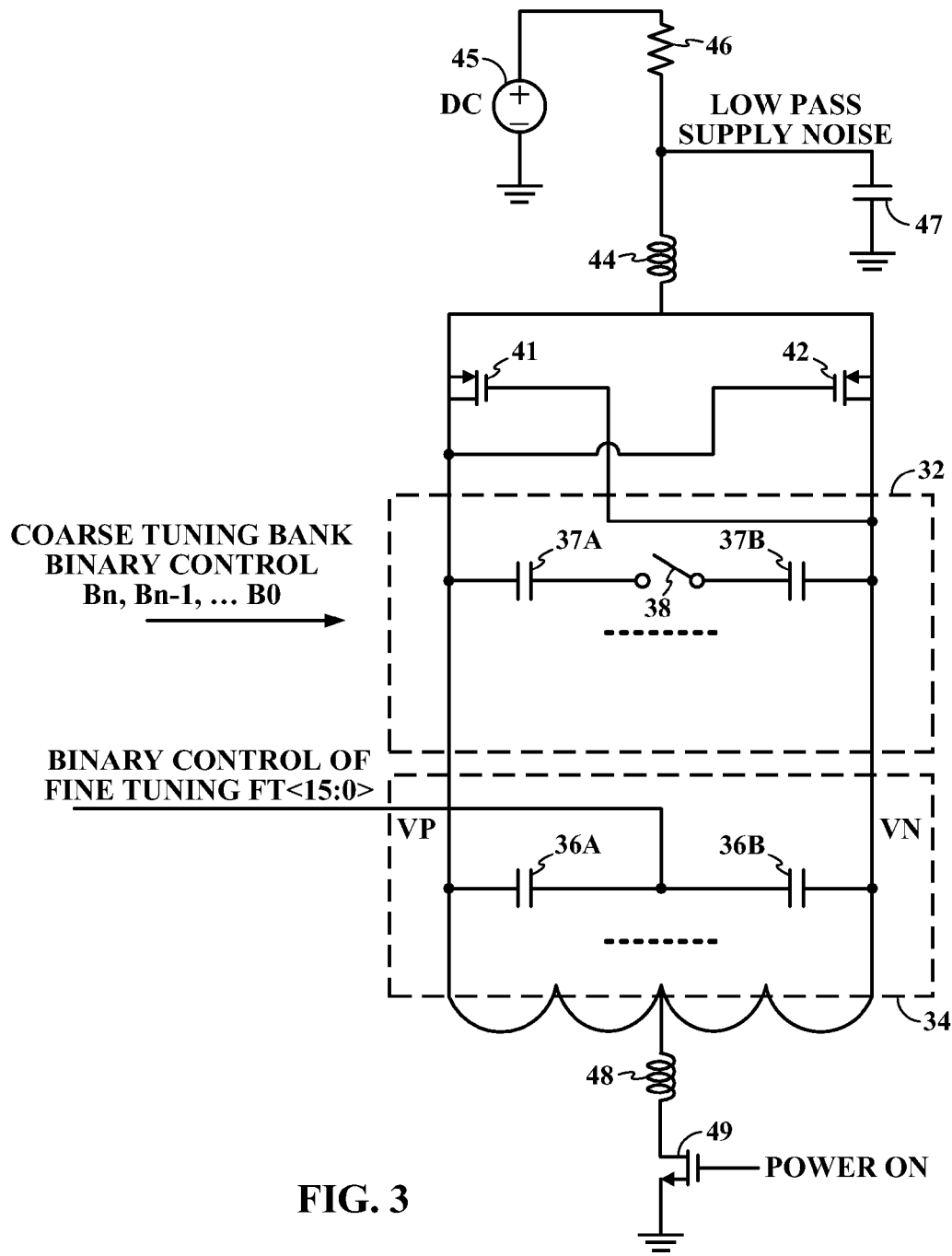
FIG. 3 is a circuit diagram of an exemplary DCO according to this disclosure.

FIG. 3 is a circuit diagram of an exemplary DCO 30 according to this disclosure. DCO 30 comprises an inductor-capacitor (LC) circuit that includes a coarse digital tuning unit 32 and a fine digital tuning unit 34. The inductor-capacitor circuit may include one or more inductors (such as inductors 44 and 48) and many capacitors. The capacitors of the inductor-capacitor circuit may include one or more fixed capacitors (not shown in FIG. 3), and many discrete and selectable switched capacitors within arrays that form coarse and fine digital tuning units or banks.

More specifically, according to this disclosure, the oscillating output of DCO is digitally tuned by coarse digital tuning unit 32 and a fine digital tuning unit 34. As described in greater detail below, fine digital tuning unit 34 can include many fine tuning elements, e.g., which each include capacitors 36A and 36B with a set of transistors (not shown in FIG. 3) between such capacitors 36A and 36B. Furthermore, coarse digital tuning unit 32 may include coarse tuning elements, e.g., which each include capacitors 37A and 37B with other circuit components (represented by switch 38 in FIG. 3) between such capacitors 37A and 37B. In some cases, the capacitors 37A and 37B of coarse digital tuning unit 34 may be fabricated within an inductor of the inductor-capacitor circuit of DCO 30 as further explained below.

As shown in FIG. 3, DCO 30 may include a DC voltage source 45 that supplies power to the circuit. Transistor 49 provides a power-on switch. Voltage drops occur across resistor 46 and inductor 44 of the inductor-capacitor circuit. A capacitor 47 may be included between ground and the common node of resistor 46 and inductor 44 to create a low-pass RC filter to block supply noise. The voltage output of DCO 30 toggles between voltage positive (VP) and voltage negative (VN). Transistors 41 and 42 are located with VN and VP at the respective gates of transistors 41 and 42 to create this toggling. Inductor 48 is located between transistor 49 and toggling output between VP and VN. This toggling output between VP and VN is caused by the transconductance (−Gm) of DCO 30.

Figure 4:
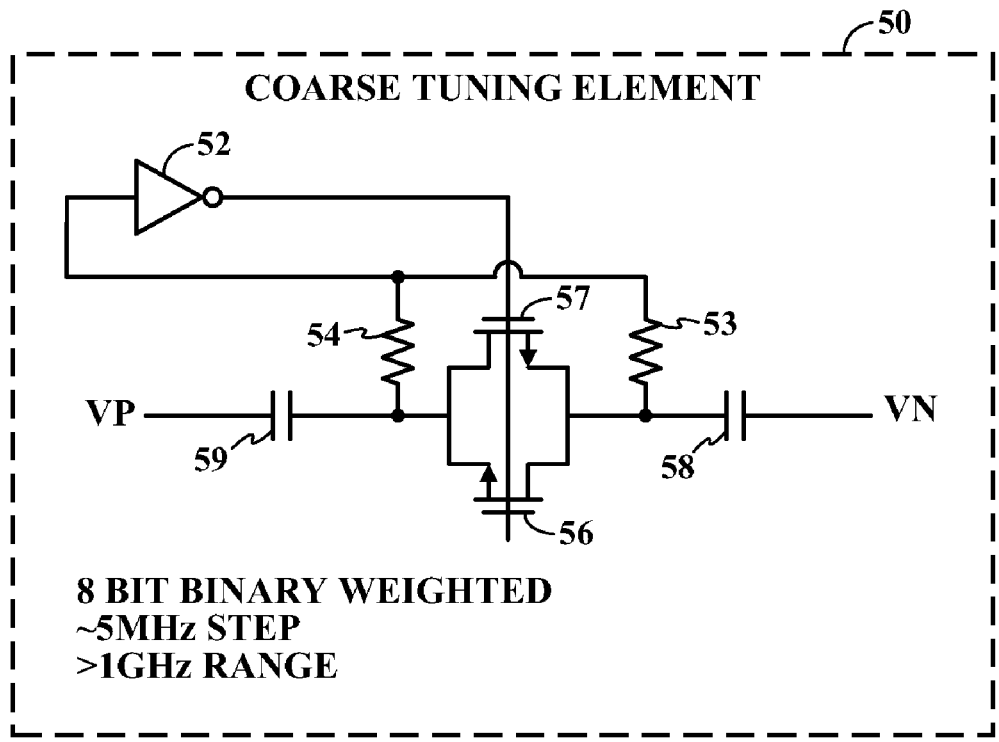
FIG. 4 is a circuit diagram of an exemplary coarse digital tuning control element which may be used in a DCO according to this disclosure.

FIG. 4 is a circuit diagram of an exemplary coarse tuning element 50 which may be used in a DCO according to this disclosure. Several of such elements 50 may be included in coarse digital tuning unit 32. With the addition of each coarse tuning element 50, approximately 2-8 MHz (depending on the DCO frequency) of control is provided to the frequency of the toggling between VP and VN. In other words, each coarse tuning element 50 adds or subtracts 5 MHz from the output frequency depending on whether the element is switched on or off by a digital control signal. Each coarse tuning element 50 is turned on via application of a control voltage to the gates of transistors 56 and 57. As VP and VN toggle, voltages cross capacitors 59 and 58, respectively. This causes respective voltages drops across resistors 54 or 53 before being inverted by inverter 52. The output of inverter 52 completes the circuit of coarse tuning element at the gates of transistors 56 and 57. Other types of coarse tuning elements could also be used in accordance with this disclosure.

Figure 5:
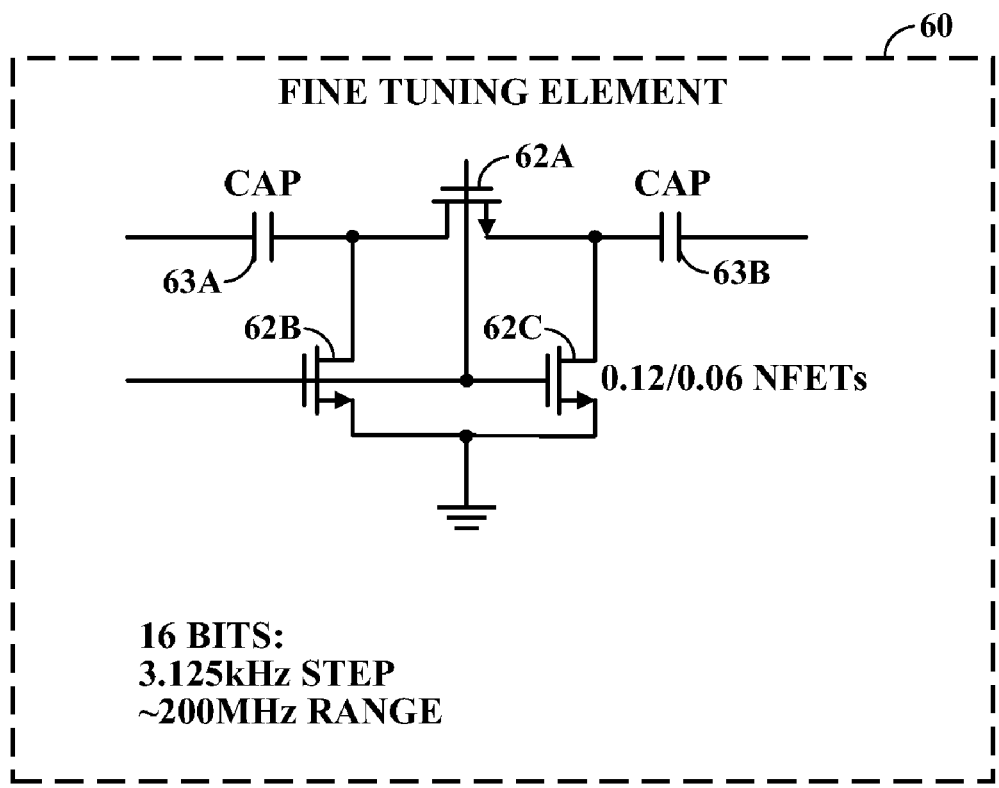
FIG. 5 is a circuit diagram of an exemplary fine digital tuning control element which may be used in a DCO according to this disclosure.
Figure 9:
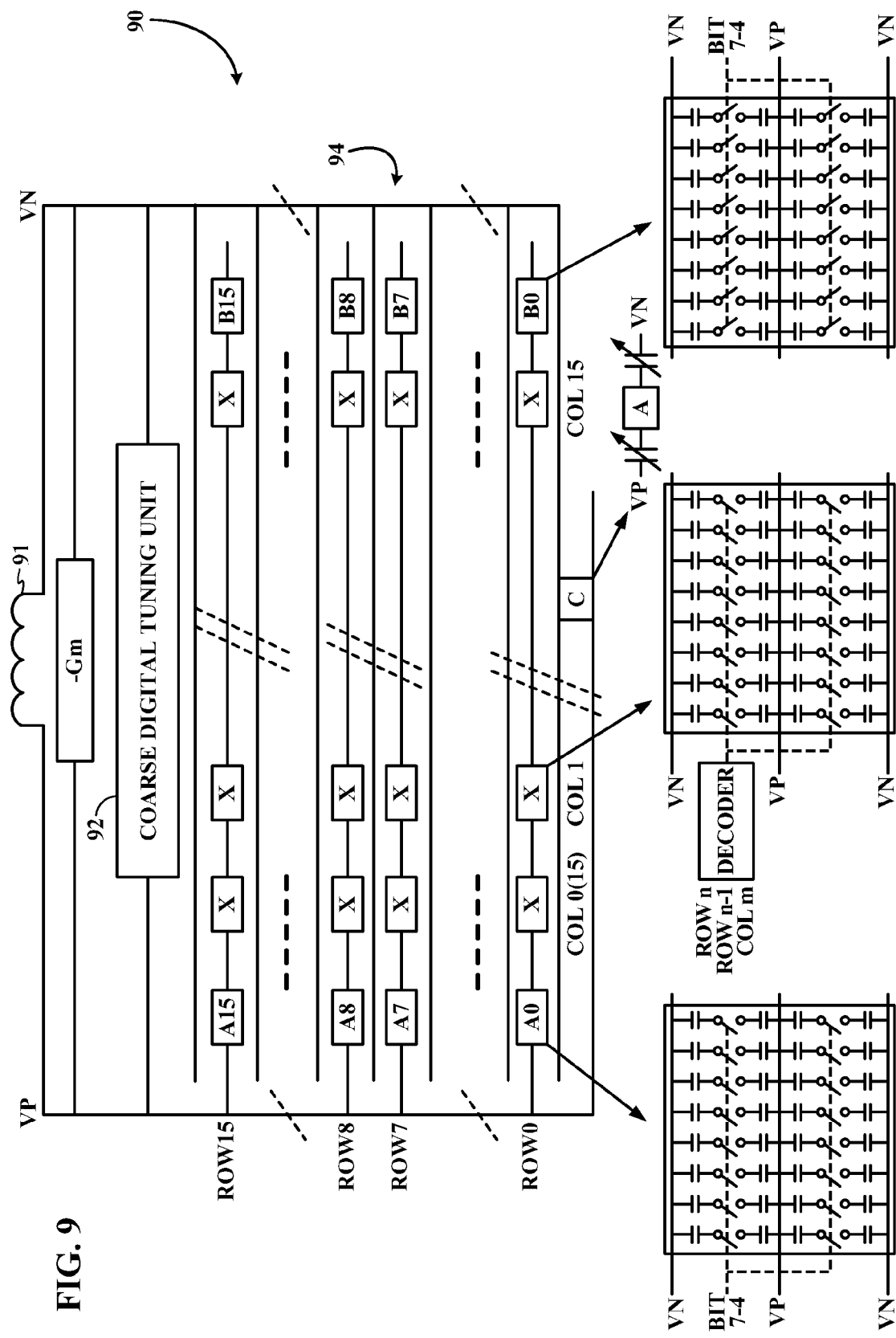
FIG. 9 is a block diagram of an exemplary DCO according to this disclosure.
Figure 10:
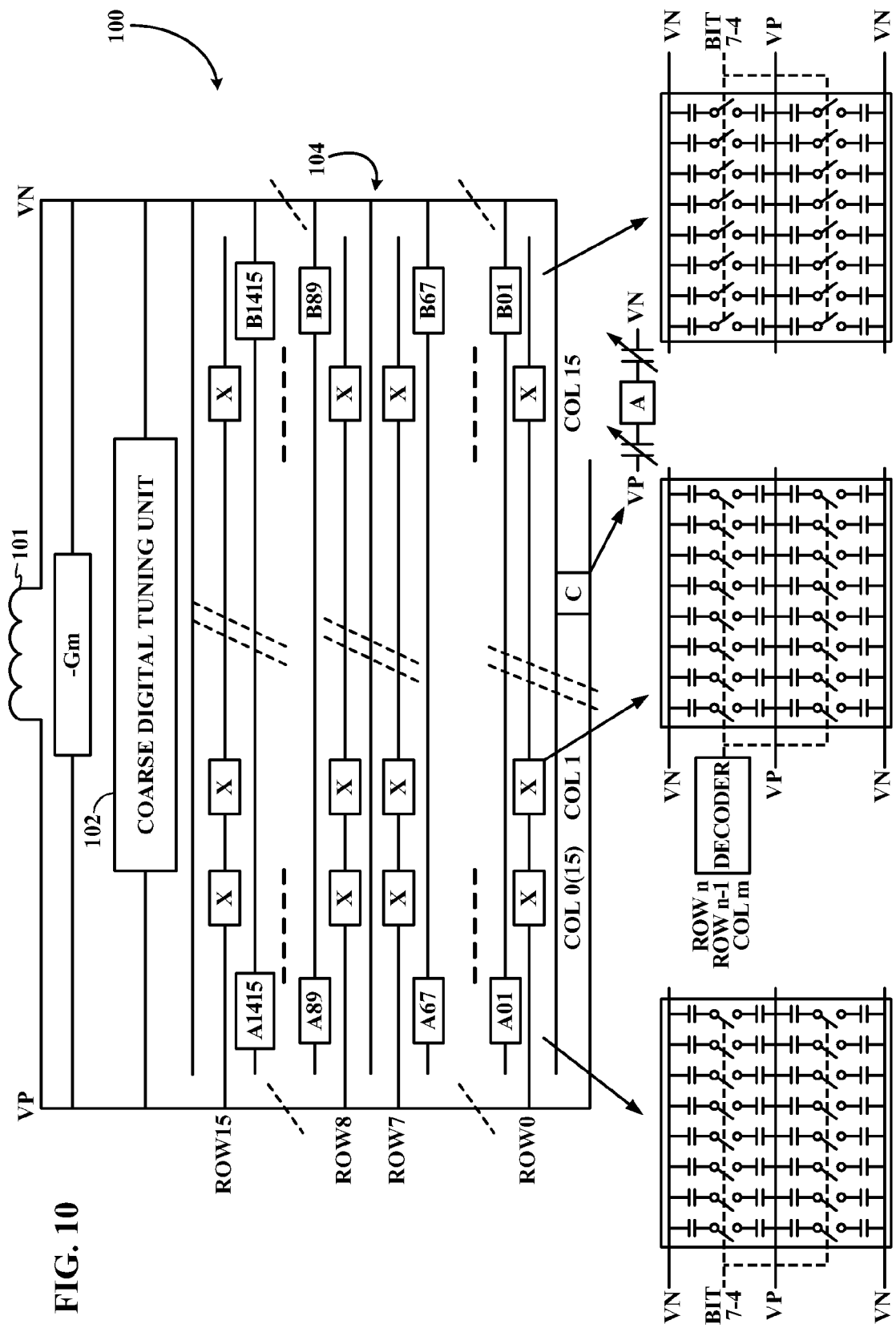
FIG. 10 is a block diagram of another exemplary DCO according to this disclosure.

FIG. 5 is an exemplary circuit diagram of an exemplary fine tuning element 60 which may be used in a DCO according to this disclosure. Many of such elements 60 may be included in fine digital tuning unit 34. Indeed, in some cases, at least 4096 fine tuning elements 60 may be included in fine digital tuning unit 34. With the addition of each fine tuning element 60 approximately 4 kHz of control is provided to the frequency of the toggling between VP and VN. Fine tuning element 60 is very useful insofar as it provides sufficient resolution for the control of the frequency of the DCO in increments less than 4 kHz. If additional the "C" units shown in FIGS. 9 and 10 are used, frequency control step can be further reduced to 4 kHz/16).

Each fine tuning element may comprise plate capacitors 63A and 63B, and three transistors 62A, 62B and 62C between the plate capacitors 63A and 63B. The three transistors 62A, 62B and 62C may comprise negative-channel metal-oxide semiconductor (NMOS) transistors. More specifically, fine tuning element 60 comprises a first plate capacitor 63A, a second plate capacitor 63B, a first transistor 62A that couples the first plate capacitor 63A to the second plate capacitor 63B, a second transistor 62B that couples the first plate capacitor 63A to ground and a third transistor 62C that couples the second plate capacitor 63B to ground.

The three transistors 62A, 62B and 62C are controlled by a common gate voltage. A drain of the first transistor 62A is coupled to a first one of the plate capacitors 63A and a source of the first transistor 62A is coupled to a second one of the plate capacitors 63B. A drain of the second transistor 62B is coupled to the first one of the plate capacitors 63A and a source of the second transistor 62B is coupled to a ground voltage. A drain of the third transistor 63C is coupled to a second one of the plate capacitors 62B and a source of the third transistor 63C is coupled to the ground voltage.

When the control is high (digital bit=1), all three transistors 63A, 63B and 63C will be on (conduct). When this occurs, the two capacitors 62A and 62B are effectively shunted to ground, discharging the voltages on the capacitors. When the control is low (digital bit=0), all three transistors 63A, 63B and 63C will be off (non-conduct). When this occurs, the two capacitors 62A and 62B will be floating at the sides of the transistors 63A, 63B and 63C, effectively providing no loading to the circuit. The difference between the two states effectively changes capacitance in the fine digital tuning unit to adjust the output frequency of toggling between VP and VN in a very fine increment (e.g., approximately 4 kHz). The two transistors on the bottom 63B and 63C provide fast recovery for the two nodes between capacitors 62A and 62B when the control voltage switches from low to high to maintain the two nodes to approximately at ground level.

Figure 6:
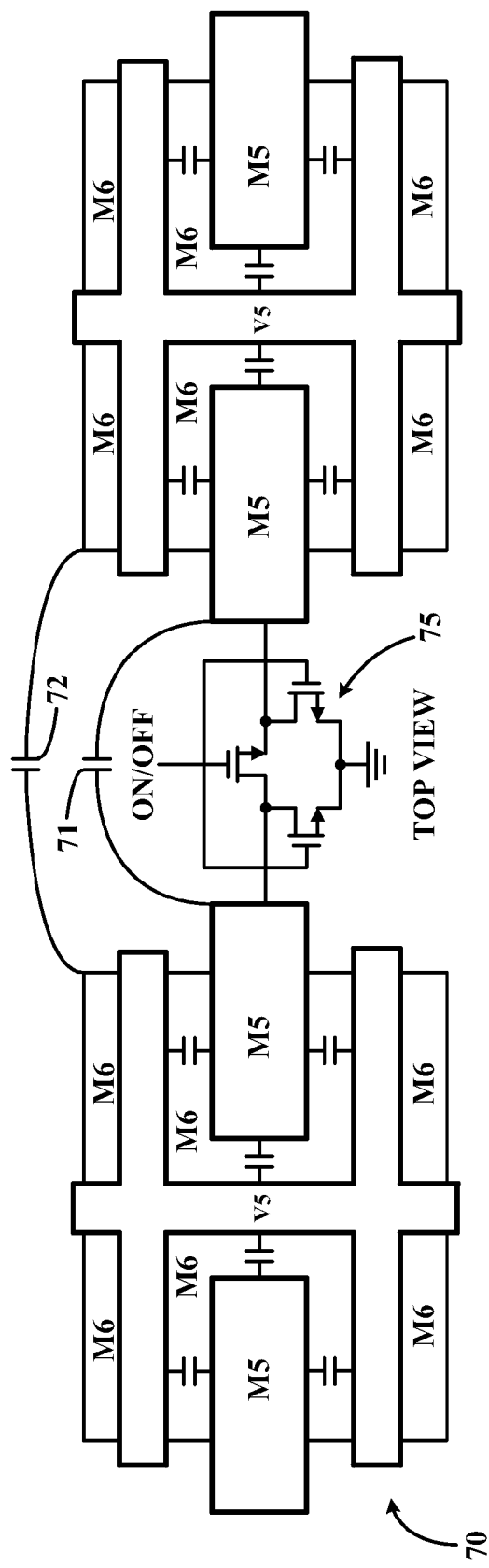
FIGS. 6 and 7 and top and side views, respectively, illustrating a fine digital tuning control element, which specifically illustrates a design that may be used for the plate capacitors.
Figure 7:
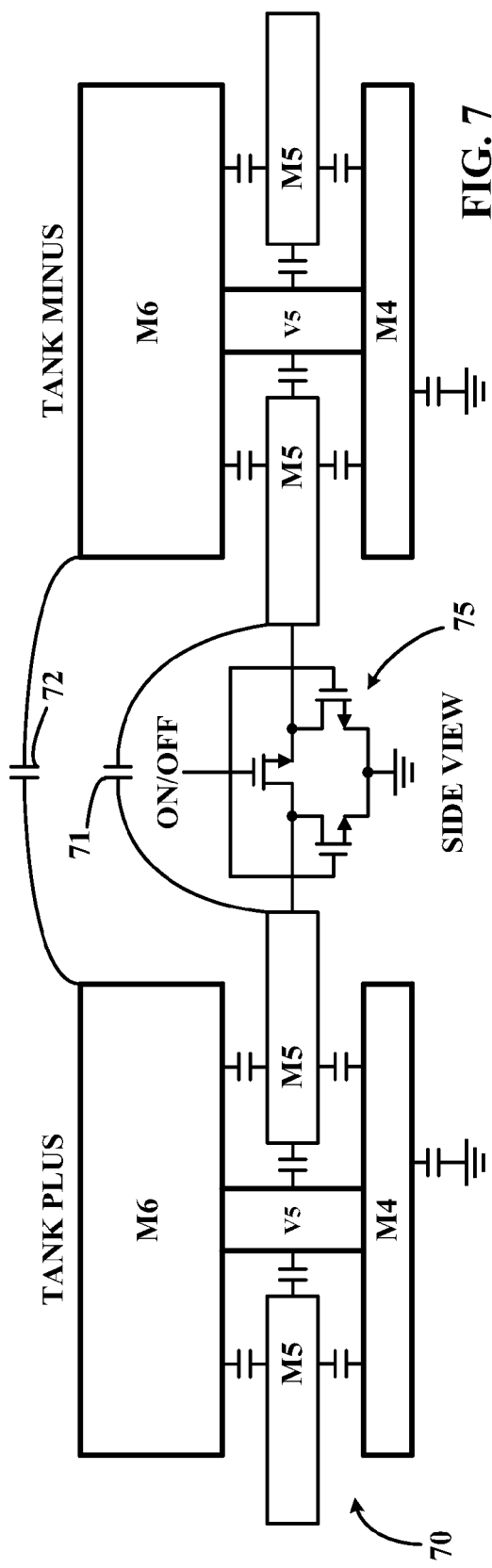

FIGS. 6 and 7 and top and side views, respectively, illustrating a fine digital tuning control element 70, which specifically illustrates a design that may be used for the plate capacitors. Importantly, the overall capacitance (which can be turned on an off) in fine digital tuning control element 70 is less than approximately 1000 attoFarads (aF). This overall capacitance is less than approximately 1000 aF and includes any parasitic capacitance within fine digital tuning control element 70. For example, the capacitor designs shown in FIGS. 6 and 7 may be defined for a capacitance of approximately 360 aF, with parasitic capacitance in fine digital tuning control element 70 bringing the overall capacitance of element 70 to a value between approximately 515 aF and 665 aF. The capacitor values listed above are exemplary. Smaller capacitor values could be used to generate finer steps, but would reduce the overall fine tuning range.

Due the small DCO tuning step requirement in fine digital tuning control element 70, the capacitance has to be very small, i.e., less than approximately 1000 aF. To achieve this fine digital tuning, control element 70 exploits the fringing capacitance between different metal layers. In other words, different metal layers (labeled M4, M5, M6 and V4) of fine digital tuning control element 70 define a so-called "plate" capacitor, and the fringing capacitance between the different metal layers allows the fine digital tuning step requirements of less than 1000 aF to be met.

The plate capacitor design shown in FIGS. 6 and 7 includes several metal layers or "plates" labeled M4, M5, M6 and V4. The metal layer or plate labeled M5 is one terminal for the capacitor and various combinations of metal layers or plates M4, M6 and V4 defines the other terminal of the capacitor. Various capacitors (unlabeled) are illustrated to show the combinations. The illustrated geometry of the plate capacitor design shown in FIGS. 6 and 7 may be very close to a minimum feature size that can be created for a plate capacitor.

The plate capacitors may be designed through parasitic extraction flow in integrated circuit design kit. The plate capacitors may not comprise typical existing capacitor components in the design kit because such small capacitor values are not practical for an individual capacitance component.

There is additional capacitance shown in the figure (labeled 71 and 72) which is parasitic capacitance associated with this fine tuning element 70. This parasitic capacitance may degrade the tuning range because the effective capacitance difference will be smaller between the on and off states. The three transistors 75 between the plate capacitors control the on-off switching of fine tuning element 70, and are discussed in greater detail above with reference to FIG. 5.

Figure 8:
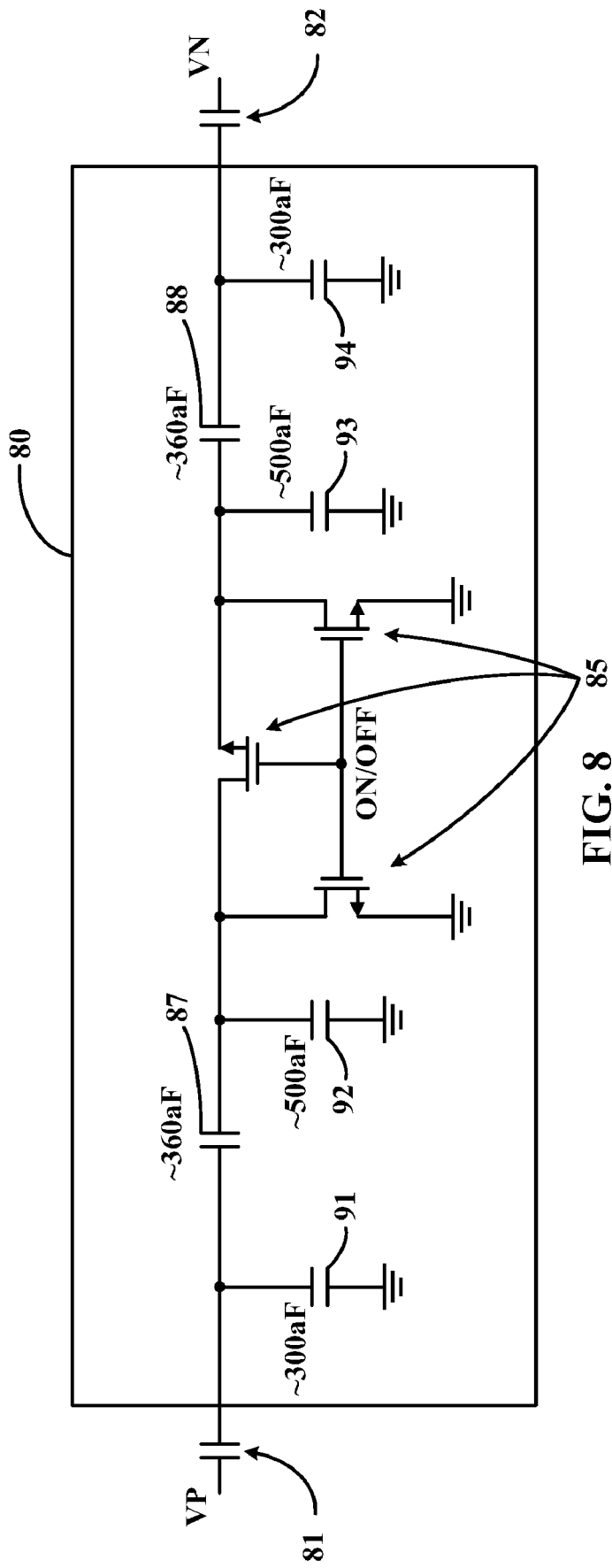
FIG. 8 is a circuit diagram illustrating a fine digital tuning control element between capacitors.

FIG. 8 is a circuit diagram illustrating a fine digital tuning control element 80 between capacitors 81 and 82. As discussed above, a fine digital tuning control element 80, according to this disclosure, includes three transistors 85 between plate capacitors. In the circuit diagram of FIG. 8, the plate capacitors 87 and 88 are shown between transistors 85 with additional parasitic capacitors 91, 92, 93 and 94 between ground and the respective nodes of plate capacitors 87 and 88. In order to implement a fine digital tuning unit, many fine digital tuning control elements are needed. In order to fully exploit 12 bits of control over $2^{12}$ levels, 4096 independently controllable fine tuning elements are needed. If even finer steps are required, additional 4 bits of binary weighted tuning control can be added to provide total of 16 bits of control. In some cases, a 16-bit control word allows for control over $2^{16}$ levels.

Additional capacitors 81 and 82 can decrease a percentage of capacitance change in the DCO that is controlled by each fine digital tuning control element 80. Capacitors 81 and 82 may be positioned between an inductor of the DCO inductor-capacitor circuit and the coarse and fine digital tuning units. Although FIG. 8 illustrates capacitors 81 and 82 with respect to one fine digital tuning control element 80, these capacitors 81 and 82 may effect every control element (coarse and fine) of the DCO inductor-capacitor circuit described herein. Thus, capacitors 81 and 82 can reduce a percentage of capacitance change in the DCO that is controlled by each of the coarse and fine digital tuning units. Exemplary approximate capacitance values are illustrated in FIG. 8, although these values could be changed in other embodiments.

FIG. 9 is a block diagram of an exemplary DCO 90 according to this disclosure, which shows circuit schematics of a fine digital tuning unit 94. As shown in FIG. 9, DCO 90 comprises an inductor-capacitor circuit that generates a transconductance (-Gm). Element 91 represents the inductor coil of the inductor-capacitor circuit. The output of DCO 90 toggles between a positive voltage (VP) and a negative voltage (VN). The frequency of this toggling is digitally controlled by a coarse digital tuning unit 92 and a fine digital tuning unit 94. The additional capacitors 81 and 82 (shown in FIG. 8) are not illustrated in FIG. 9, but could be added between element 91 and units 92 and 94 in order to reduce a percentage of capacitance change in the DCO that is controlled by each of the coarse and fine digital tuning units 92, 94.

Coarse digital tuning unit 92 includes a plurality of coarse tuning elements, such as that illustrated in FIG. 3 and described above. Each of these coarse tuning elements can provide, e.g., approximately 5 MHz of control over the output frequency of DCO. Similarly, fine digital tuning unit 94 includes a plurality of fine tuning elements such as that illustrated in FIG. 4 and described above. Each of these fine tuning elements can provide, e.g., less than approximately 4 kHz of control over the output frequency of DCO 90. One or more digital control words provide a mechanism for the tuning of the coarse and fine digital tuning units 92 and 94.

More specifically, as shown in FIG. 9, fine digital tuning unit 94 comprises a plurality of sets of fine tuning elements.

Each of the sets (labeled A, A0-A15, X, B0-B15 and C) includes sixteen fine tuning elements. The plurality of sets of fine tuning elements may comprise sixteen rows of the sets of fine tuning elements. Altogether, fine digital tuning unit 94 includes at least 4096 fine tuning elements.

Parasitic capacitance can destroy linearity in DCO 90, in which case a tuning range can become degraded to a point it will not work. In terms of an oscillator design, the center frequency of the oscillator typically depends on both inductance and capacitance of the inductor-capacitor circuit. The same unit capacitors at different locations, however, will have different inductance associated with them due to the different locations within the circuit, and therefore, the frequency tuning will be different for capacitors at different locations.

To solve these issues of potential non-linearity, given a control word (say 16-bits) one can duplicate least significant bit (LSB) sets of elements and place them close to most significant bit (MSB) sets of elements. In other words, the duplication of sets of elements (labeled A, A0-A15, X, B0-B15 and C), as shown in FIG. 9, can help to ensure linearity in the control of DCO 90.

The "C" units can provide additional 4 bits of binary weighted control and may include 16 finer tuning elements that can be individually controlled. The capacitance values can be scaled by the two capacitors series with the A units and connected to VP and VN. Therefore, the total capacitance step when all 16 units are switched on and off can be equal to that of elements in A or B or X. The 16-bit control work may provide $2^{16}$ levels of digital control.

An oscillator oscillating frequency depends on the overall lumped capacitance and inductance. For equal value capacitors at different distance to the main inductor and capacitor tank the frequency step could be different due to additional trace inductance and trace capacitance. Also, due to semiconductor processing there could be a gradient for capacitance density value. This requires thermometer elements type of tuning instead of simple binary weighted tuning to maintain monotonic and linearity.

Given a 16-bit control word, the top four binary bits may be used to select rows of the sets of elements. The second four bits of the 16-bit control word may be used to select columns (e.g., from 16 columns) of the sets of elements. The third four bits of the 16-bit control word can be used to select combinations of elements from the A, B and X sets of elements. The fourth four bits of the 16-bit control word can be used to select elements from the C set of elements for final resolution down to increments less than approximately 4 kHz.

As an illustration, the following control words may be used to decode row 0 within DCO 90. More generally, within each row, depending on bits <11:8> and column location, a number of A and B units will be decoded for that row. All the A's and B's in other rows will be turned off.

The following tables illustrate exemplary coding of row 0, e.g., the bit values for bits 11 to 8 and bit 7 to 4 of a 16-bit control word and the corresponding number of A sets and B sets that may be used given that control word. Column 0 refers to the rightmost column.

| <11:8> | <7:4> | A | B | A + B <7:4> |
|---|---|---|---|---|
| Column 0 ||||| 
| 0000 | 0000 | 0 | 0 | 0 |
| 0000 | 0001 | 1 | 0 | 1 |
| 0000 | 0010 | 2 | 0 | 2 |

-continued

| <11:8> | <7:4> | A | B | A + B <7:4> |
|---|---|---|---|---|
| 0000 | 0011 | 3 | 0 | 3 |
| ... | | | | |
| 0000 | 1101 | 13 | 0 | 13 |
| 0000 | 1110 | 14 | 0 | 14 |
| 0000 | 1111 | 15 | 0 | 14 |
| Column 1 ||||| 
| 0001 | 0000 | 0 | 0 | 0 |
| 0001 | 0001 | 1 | 0 | 1 |
| 0001 | 0010 | 2 | 0 | 2 |
| ... | | | | |
| 0001 | 1110 | 14 | 0 | 14 |
| 0001 | 1111 | 14 | 1 | 15 |
| Column 2 ||||| 
| 0010 | 0000 | 0 | 0 | 0 |
| 0010 | 0001 | 1 | 0 | 1 |
| ... | | | | |
| 0010 | 1100 | 12 | 0 | 12 |
| 0010 | 1101 | 13 | 0 | 13 |
| 0010 | 1110 | 13 | 1 | 14 |
| 0010 | 1111 | 13 | 2 | 15 |
| ... | | | | |
| ... | | | | |
| ... | | | | |
| Column 8 ||||| 
| 1000 | 0000 | 0 | 0 | 0 |
| 1000 | 0001 | 1 | 0 | 1 |
| 1000 | 0010 | 2 | 0 | 2 |
| 1000 | 0011 | 3 | 0 | 3 |
| ... | | | | |
| 1000 | 0111 | 7 | 0 | 7 |
| 1000 | 1000 | 8 | 0 | 8 |
| 1000 | 1001 | 8 | 1 | 9 |
| 1000 | 1010 | 8 | 2 | 10 |
| ... | | | | |
| 1000 | 1110 | 8 | 6 | 14 |
| 1000 | 1111 | 8 | 7 | 15 |
| Column 14 ||||| 
| 1110 | 0000 | 0 | 0 | 0 |
| 1110 | 0001 | 1 | 0 | 1 |
| 1110 | 0010 | 1 | 1 | 2 |
| 1110 | 0011 | 1 | 2 | 3 |
| ... | | | | |
| 1110 | 1110 | 1 | 13 | 14 |
| 1110 | 1111 | 1 | 14 | 15 |
| Column 15 ||||| 
| 1111 | 0000 | 0 | 0 | 0 |
| 1111 | 0001 | 0 | 1 | 1 |
| 1111 | 0010 | 0 | 2 | 2 |
| ... | | | | |
| 1111 | 1110 | 0 | 14 | 14 |
| 1111 | 1111 | 0 | 15 | 15 |

The next set of tables illustrates exemplary coding of row 1, e.g., the bit values for bits 11-8 and 7-4 of a control word and the corresponding number of A sets and B sets that may be used given that control word. Again, column 0 refers to the rightmost column.

| <11:8> | <7:4> | B | A | B + A <7:4> |
|---|---|---|---|---|
| Column 0 ||||| 
| 0000 | 0000 | 0 | 0 | 0 |
| 0000 | 0001 | 1 | 0 | 1 |
| 0000 | 0010 | 2 | 0 | 2 |
| 0000 | 0011 | 3 | 0 | 3 |
| ... | | | | |

-continued

| <11:8> | <7:4> | B | A | B + A <7:4> |
|---|---|---|---|---|
| 0000 | 1101 | 13 | 0 | 13 |
| 0000 | 1110 | 14 | 0 | 14 |
| 0000 | 1111 | 15 | 0 | 14 |
| | Column 1 | | | |
| 0001 | 0000 | 0 | 0 | 0 |
| 0001 | 0001 | 1 | 0 | 1 |
| 0001 | 0010 | 2 | 0 | 2 |
| ... | | | | |
| 0001 | 1110 | 14 | 0 | 14 |
| 0001 | 1111 | 14 | 1 | 15 |
| | Column 2 | | | |
| 0010 | 0000 | 0 | 0 | 0 |
| 0010 | 0001 | 1 | 0 | 1 |
| ... | | | | |
| 0010 | 1100 | 12 | 0 | 12 |
| 0010 | 1101 | 13 | 0 | 13 |
| 0010 | 1110 | 13 | 1 | 14 |
| 0010 | 1111 | 13 | 2 | 15 |
| | ... | | | |
| | ... | | | |
| | ... | | | |
| | Column 8 | | | |
| 1000 | 0000 | 0 | 0 | 0 |
| 1000 | 0001 | 1 | 0 | 1 |
| 1000 | 0010 | 2 | 0 | 2 |
| 1000 | 0011 | 3 | 0 | 3 |
| ... | | | | |
| 1000 | 0111 | 7 | 0 | 7 |
| 1000 | 1000 | 8 | 0 | 8 |
| 1000 | 1001 | 8 | 1 | 9 |
| 1000 | 1010 | 8 | 2 | 10 |
| ... | | | | |
| 1000 | 1110 | 8 | 6 | 14 |
| 1000 | 1111 | 8 | 7 | 15 |
| | Column 14 | | | |
| 1110 | 0000 | 0 | 0 | 0 |
| 1110 | 0001 | 1 | 0 | 1 |
| 1110 | 0010 | 1 | 1 | 2 |
| 1110 | 0011 | 1 | 2 | 3 |
| ... | | | | |
| 1110 | 1110 | 1 | 13 | 14 |
| 1110 | 1111 | 1 | 14 | 15 |
| | Column 15 | | | |
| 1111 | 0000 | 0 | 0 | 0 |
| 1111 | 0001 | 0 | 1 | 1 |
| 1111 | 0010 | 0 | 2 | 2 |
| ... | | | | |
| 1111 | 1110 | 0 | 14 | 14 |
| 1111 | 1111 | 0 | 15 | 15 |

A value of 14 for B means 14 of the 16 units in B will be used. The 14 units could be different 14 units and sophisticated dynamic element matching scheme can be utilized.

The above coding scheme uses decoding logic and elements for each row. However, one can simplify this scheme by using the same A and B sets for every two rows as shown below:

Row 0 and row 2 share A02 and B02
Row 1 and row 3 share A13 and B13
Row 4 and row 6 share A46 and B46
Row 5 and row 7 share A57 and B57
Row 8 and row a share A8a and B8a
Row 9 and row b share A9b and B9b
Row c and row e share Ace and Bce
Row d and row f share Adf and Bdf This alternative scheme is illustrated in FIG. 10.

In other words, DCO 100 of FIG. 10 is very similar to DCO 90 of FIG. 9, but may allow for more simplified coding by using the same A and B sets for every two rows, as set forth above. In the block diagram of FIG. 10, DCO 100 comprises an inductor-capacitor circuit that generates a transconductance (−Gm). Element 101 represents the inductor coil of the inductor-capacitor circuit. The output of DCO 100 toggles between a positive voltage (VP) and a negative voltage (VN). The frequency of this toggling is digitally controlled by a coarse digital tuning unit 102 and a fine digital tuning unit 104. The additional capacitors 81 and 82 (shown in FIG. 8) are not illustrated in FIG. 10, but could be added between element 101 and units 102 and 104 in order to reduce a percentage of capacitance change in the DCO that is controlled by each of the coarse and fine digital tuning units 102 and 104.

Coarse digital tuning unit 102 includes a plurality of coarse tuning elements, such as that illustrated in FIG. 3 and described above. Fine digital tuning unit 104 comprises a plurality of sets of fine tuning elements. Each of the sets includes sixteen fine tuning elements. The plurality of sets of fine tuning elements may comprise sixteen rows of the sets of fine tuning elements. The same A and B sets are used for every two rows. The set A1415 represents an A set for rows 14 and 15. Similar notation is used for set B1415, set A89, set B89, set A67, set B67, set A01 and set B01. Other than the sharing of sets of elements between rows, DCO 100 is generally similar to DCO 90 of FIG. 9.

Figure 11:
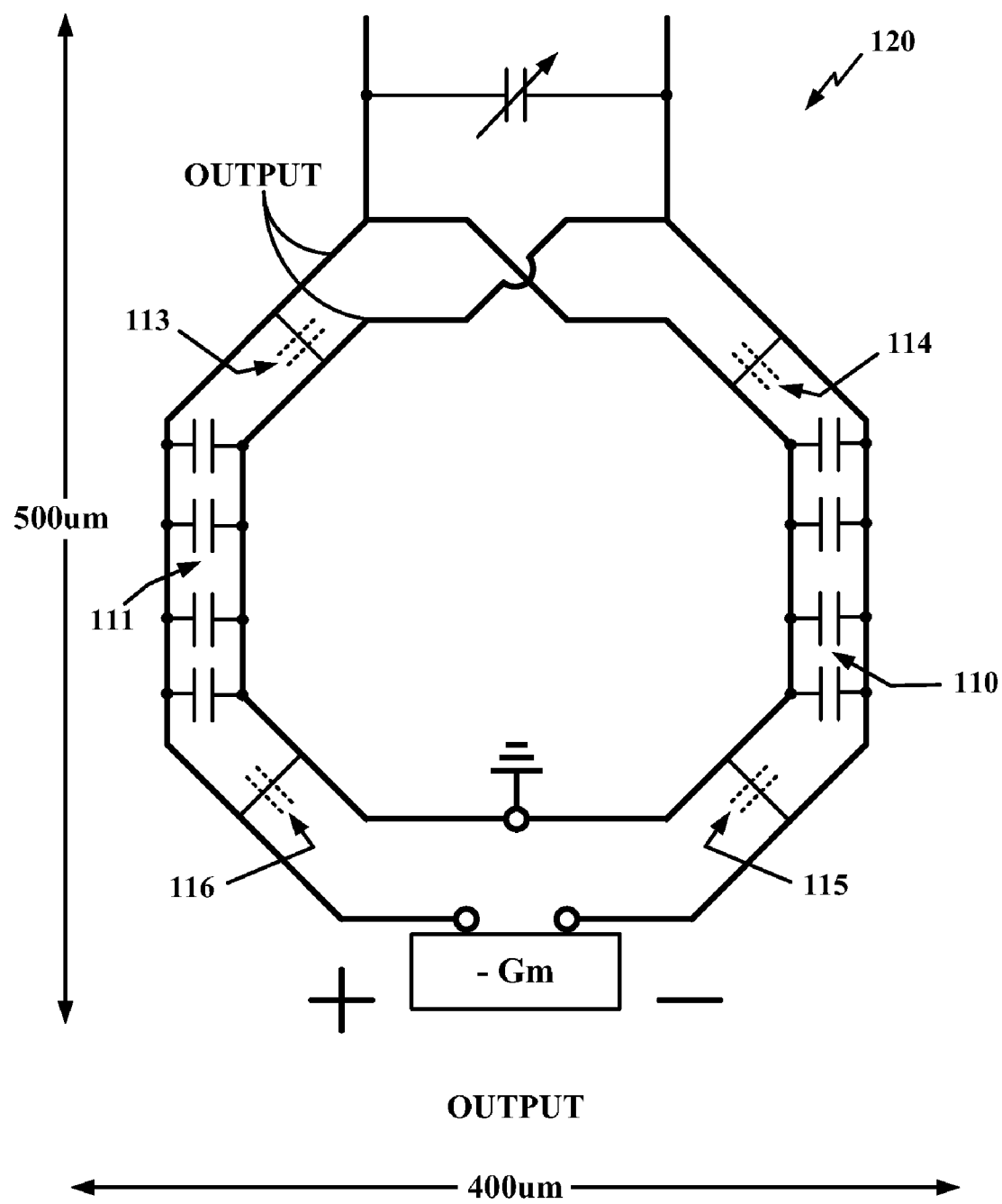
FIG. 11 is a circuit diagram illustrating capacitors of coarse tuning elements being positioned inside an inductor.

FIG. 11 is a circuit diagram illustrating capacitors of coarse tuning elements being positioned inside an inductor. In particular, circuit 120 may comprise a portion of the inductor-capacitor DCO described herein. Circuit 120 includes an inductor coil 122 that defines the transconductance (−Gm) of the inductor-capacitor DCO. For ease of illustration, the digital fine tuning control unit is not shown. Importantly, capacitors 110 and 111 (as well as optional capacitors 113-116) are positioned inside inductor coil 122 between respective inner and outer coil elements. The approximate size of circuit 120 is labeled in FIG. 11. Capacitors 110 and 111 (as well as optional capacitors 113-116) may correspond to capacitors 58 and 58 of FIG. 4. In this manner, the surface area needed to fabricate coarse tuning elements and an inductor can be partially combined for efficiency.

Figure 12:
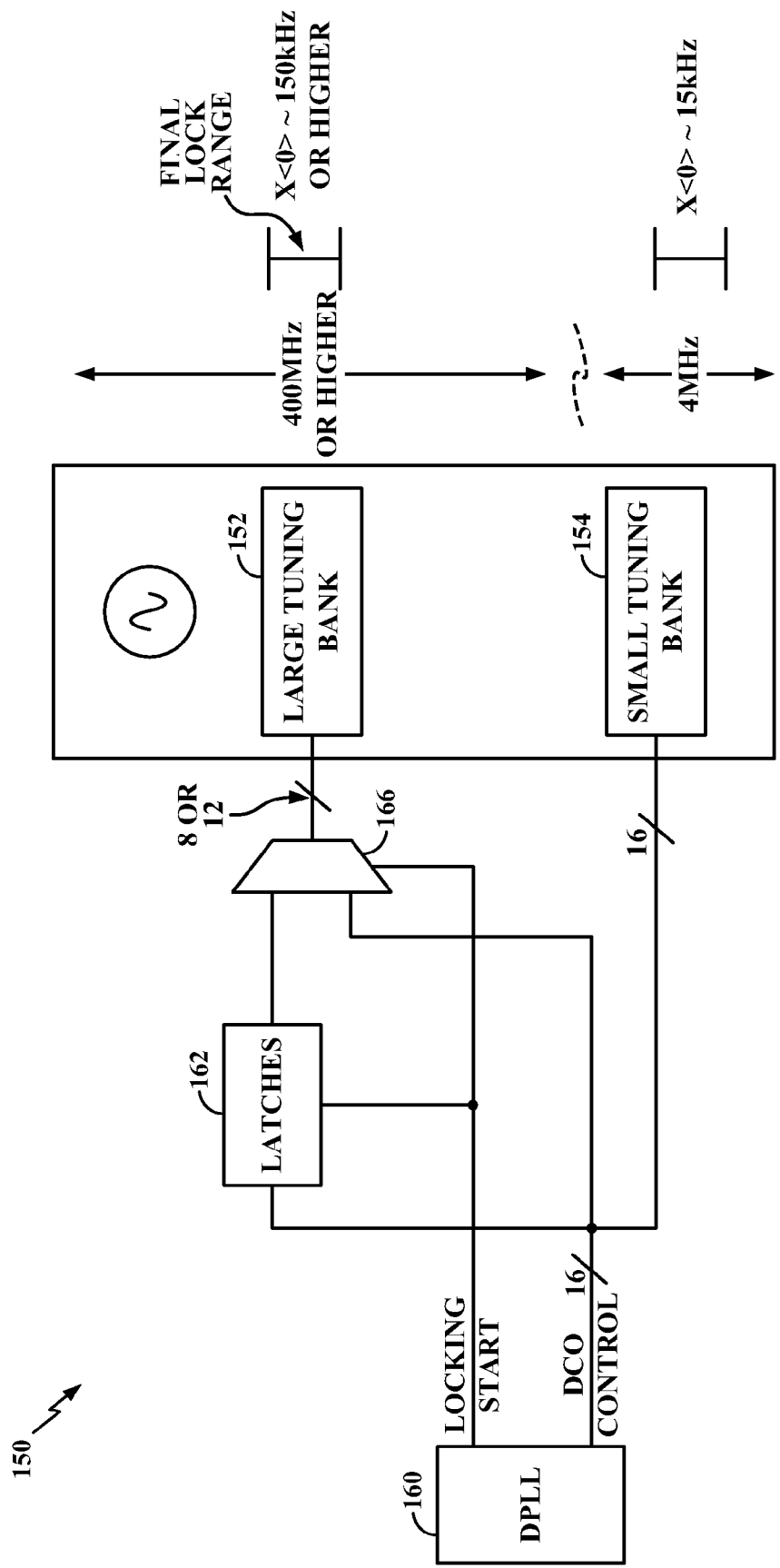
FIG. 12 is a block diagram of a fine DCO control unit that supports two different modes of operation according to an embodiment of this disclosure.

FIG. 12 is a block diagram of a fine DCO control unit 150 that supports two different modes of operation according to an embodiment of this disclosure. There is a trade off between step size and total modulation bandwidth. In a GSM mode, for example, it may be preferred to have smaller steps and better modulation accuracy, while in a CDMA mode large modulation bandwidth may be needed (yet less accuracy) to cover long term temperature and supply drift. For the small bandwidth case, there is a limitation due to coarse tuning accuracy needing to be better than total modulation range. This is very difficult due to the open loop tuning.

Fine DCO control unit 150 may correspond to any one of those described above. However, in fine DCO control unit 150, a large tuning bank 152 and a small tuning bank 154 are defined. In a first mode (such as CDMA), both the large and small tuning banks 152 and 154 of fine digital tuning unit 150 provide adjustments to the oscillating signal. In a second mode (such as GSM), the small tuning bank may not be used and only the large tuning bank of the fine digital tuning unit provides adjustments to the oscillating signal.

The two tuning banks 152 and 154 are in parallel in the coarse tuning and acquisition periods. Large tuning bank 152 has larger steps compared to the small tuning bank 154. Large tuning bank 152, for example, may only need to use the 8 most significant bits of a 16 bit control word, whereas small tuning bank 154 may need the full 16 bits. There is no matching requirement between the two banks.

First, the loop starts in fast mode (large loop bandwidth) with both banks are in parallel and in closed loop control implemented by a digital phase locked loop 160. After the loop settles, or after a programmable wait time, a DCO control will implement latches 162 to latch the top bank control bits (to 8 or 12 control bits). Multiplexer 166 forwards the appropriate control bits to large tuning bank 154. Then, the loop starts lock again and to prepare transmission. The range of large tuning bank 152 should be large enough to ensure that the final DCO control closes to a center frequency.

Loop settings can be changed when switching between the modes. Large tuning bank 152 may define a tuning range of approximately 400 MHz or greater, whereas small tuning bank may define a tuning range of approximately 4 MHz. These ranges could be changed for other embodiments.

A number of embodiments have been described. Although many detailed aspects of the various embodiments have been described as being implemented in hardware circuitry, the same or similar techniques may be implemented in software executing on a programmable digital signal processor (DSP), firmware, or various combinations of hardware, software and firmware.

In addition, in added embodiments, the fine digital tuning unit of this disclosure is not necessarily limited to the three transistor designs, but could use more or fewer transistors. Also, the transistors could be replaced with other types of switches, such as microelectromechanical (MEM) switches. Accordingly, this disclosure also contemplates a DCO comprising an inductor-capacitor circuit that generates an oscillating output, wherein the inductor-capacitor circuit includes a coarse digital tuning unit that coarsely tunes the oscillating output, and a fine digital tuning unit that finely tunes of the oscillating output, wherein the fine digital tuning unit includes fine tuning elements and wherein each of the fine tuning elements comprises plate capacitors and one or more switches between the plate capacitors. In this case, the switches may comprise one or more transistors and/or one or more microelectromechanical (MEM) switches.

These and other embodiments are within the scope of the following claims.

The invention claimed is:

1. A digitally controlled oscillator (DCO) comprising an inductor-capacitor circuit that generates an oscillating output, wherein the inductor-capacitor circuit includes:
   a coarse digital tuning unit that coarsely tunes the oscillating output, wherein each coarse digital tuning unit includes a resistor between an inverter and a capacitor; and
   a fine digital tuning unit that finely tunes the oscillating output, wherein the fine digital tuning unit includes fine tuning elements and wherein each of the fine tuning elements comprises plate capacitors and at least three transistors between the plate capacitors;
   wherein the coarse digital tuning unit includes a plurality of coarse tuning elements, and wherein the coarse tuning elements include capacitors positioned between an inner coil element and an outer coil element of an inductor of the inductor-capacitor circuit.

2. The DCO of claim 1, wherein the fine digital tuning unit comprises a first plate capacitor, a second plate capacitor, a first transistor that couples the first plate capacitor to the second plate capacitor, a second transistor that couples the first plate capacitor to ground and a third transistor that couples the second plate capacitor to ground.

3. The DCO of claim 1, wherein the transistors comprise negative-channel metal-oxide semiconductor (NMOS) transistors.

4. The DCO of claim 3, wherein the transistors comprise a first transistor, a second transistor and a third transistor and wherein:
   the transistors are controlled by a common gate voltage;
   a drain of the first transistor is coupled to a first one of the plate capacitors and a source of the first transistor is coupled to a second one of the plate capacitors;
   a drain of the second transistor is coupled to the first one of the plate capacitors and a source of the second transistor is coupled to a ground; and
   a drain of the third transistor is coupled to a second one of the plate capacitors and a source of the third transistor is coupled to the ground.

5. The DCO of claim 1, further comprising additional capacitors between an inductor of the inductor-capacitor circuit and the coarse and fine digital tuning units, wherein the additional capacitors between the inductor and the coarse and fine digital tuning units decrease a percentage of capacitance change in the DCO that is controlled by the coarse digital tuning unit and the fine digital tuning unit.

6. The DCO of claim 1, wherein the fine digital tuning unit comprises a plurality of sets of fine tuning elements, wherein each of the sets includes sixteen fine tuning elements.

7. The DCO of claim 6, wherein the plurality of sets comprises sixteen rows of the sets of fine tuning elements.

8. The DCO of claim 1, wherein the fine digital tuning unit includes at least 4096 fine tuning elements.

9. The DCO of claim 8, wherein the fine digital tuning unit supports control over at least $2^{12}$ levels.

10. The DCO of claim 8, wherein the fine digital tuning unit supports control over $2^{16}$ levels.

11. The DCO of claim 1, wherein the fine digital tuning unit includes a large tuning bank and a small tuning bank and wherein:
    in a first mode, both the large and small tuning banks of the fine digital tuning unit provide adjustments to the oscillating signal; and
    in a second mode, the small tuning bank is not used and only the large tuning bank of the fine digital tuning unit provides adjustments to the oscillating signal;
    wherein the first mode and the second mode correspond to different wireless communication technologies.

12. A method comprising:
    adjusting an oscillating output of an inductor-capacitor circuit via a coarse digital tuning unit to provide coarse digital tuning of the oscillating output, wherein each coarse digital tuning unit includes a resistor between an inverter and a capacitor; and
    adjusting the oscillating output of the inductor-capacitor circuit via a fine digital tuning unit to provide fine digital tuning of the oscillating output, wherein the fine digital tuning unit includes fine tuning elements and wherein each of the fine tuning elements comprises plate capacitors and at least three transistors between the plate capacitors;
    wherein the coarse digital tuning unit includes a plurality of coarse tuning elements, and wherein the coarse tuning elements include capacitors positioned between an inner coil element and an outer coil element of an inductor of the inductor-capacitor circuit.

13. The method of claim 12, wherein the fine digital tuning unit comprises a first plate capacitor, a second plate capacitor, a first transistor that couples the first plate capacitor to the second plate capacitor, a second transistor that couples the first plate capacitor to ground and a third transistor that couples the second plate capacitor to ground.

14. The method of claim 13, wherein the transistors comprise negative-channel metal-oxide semiconductor(NMOS) transistors.

15. The method of claim 14, wherein the transistors comprise a first transistor, a second transistor and a third transistor and wherein:
the transistors are controlled by a common gate voltage;
a drain of the first transistor is coupled to a first one of the plate capacitors and a source of the first transistor is coupled to a second one of the plate capacitors;
a drain of the second transistor is coupled to the first one of the plate capacitors and a source of the second transistor is coupled to a ground; and
a drain of the third transistor is coupled to a second one of the plate capacitors and a source of the third transistor is coupled to the ground.

16. The method of claim 13, wherein the fine digital tuning unit includes a large tuning bank and a small tuning band the method further comprising:
in a first mode, adjusting both the large and small tuning banks of the fine digital tuning unit to provide adjustments to the oscillating signal; and
in a second mode, avoiding use of the small tuning bank and adjusting only the large tuning bank of the fine digital tuning unit to provide adjustments to the oscillating signal.

17. A wireless communication device comprising:
a modem that modulates or demodulates baseband signals;
a mixer that mixes or de-mixes the baseband signals with a carrier waveform; and
a frequency synthesizer that generates the carrier waveform, wherein the frequency synthesizer includes a digitally controller oscillator (DCO) comprising an inductor-capacitor circuit that generates an oscillating output, wherein the inductor-capacitor circuit includes a coarse digital tuning unit that coarsely tunes the oscillating output, wherein each coarse digital tuning unit includes a resistor between an inverter and a capacitor, and a fine digital tuning unit that finely tunes the oscillating output, wherein the fine digital tuning unit includes fine tuning elements and wherein each of the fine tuning elements comprises plate capacitors and at least three transistors between the plate capacitors;
wherein the coarse digital tuning unit includes a plurality of coarse tuning elements, and wherein the coarse tuning elements include capacitors positioned between an inner coil element and an outer coil element of an inductor of the inductor-capacitor circuit.

18. The wireless communication device of claim 17, wherein the fine digital tuning unit comprises a first plate capacitor, a second plate capacitor, a first transistor that couples the first plate capacitor to the second plate capacitor, a second transistor that couples the first plate capacitor to ground and a third transistor that couples the second plate capacitor to ground.

19. The wireless communication device of claim 18, further comprising a transmitter that transmits a modulated carrier waveform.

20. The wireless communication device of claim 18, further comprising a receiver that receives a modulated carrier waveform.

21. The wireless communication device of claim 18, wherein the transistors comprise negative-channel metal-oxide semiconductor (NMOS) transistors.

22. The wireless communication device of claim 21, wherein the transistors comprise a first transistor, a second transistor and a third transistor and wherein:
the transistors are controlled by a common gate voltage;
a drain of the first transistor is coupled to a first one of the plate capacitors and a source of the first transistor is coupled to a second one of the plate capacitors;
a drain of the second transistor is coupled to the first one of the plate capacitors and a source of the second transistor is coupled to a ground; and
a drain of the third transistor is coupled to a second one of the plate capacitors and a source of the third transistor is coupled to the ground.

23. The wireless communication device of claim 18, further comprising additional capacitors between an inductor of the inductor-capacitor circuit and the coarse and fine digital tuning units, wherein the additional capacitors between the inductor and the coarse and fine digital tuning units decrease a percentage of capacitance change in the DCO that is controlled by the coarse digital tuning unit and the fine digital tuning unit.

24. The wireless communication device of claim 18, wherein the fine digital tuning unit comprises a plurality of sets of fine tuning elements, wherein each of the sets includes sixteen fine tuning elements.

25. The wireless communication device of claim 24, wherein the plurality of sets comprises sixteen rows of the sets of fine tuning elements.

26. The wireless communication device of claim 18, wherein the fine digital tuning unit includes at least 4096 fine tuning elements.

27. The wireless communication device of claim 26, wherein the fine digital tuning unit supports control over at least $2^{12}$ levels.

28. The wireless communication device of claim 27, wherein the fine digital tuning unit supports control over at least $2^{16}$ levels.

29. The wireless communication device of claim 18, wherein the fine digital tuning unit includes a large tuning bank and a small tuning band and wherein:
in a first mode of the wireless communication device, both the large and small tuning banks of the fine digital tuning unit provide adjustments to the oscillating signal; and
in a second mode of the wireless communication device, the small tuning bank is not used and only the large tuning bank of the fine digital tuning unit provides adjustments to the oscillating signal.

30. A digitally controlled oscillator (DCO) comprising an inductor-capacitor circuit that generates an oscillating output, wherein the inductor-capacitor circuit includes:
a coarse digital tuning unit that coarsely tunes the oscillating output, wherein each coarse digital tuning unit includes a resistor between an inverter and a capacitor, and
a fine digital tuning unit that finely tunes the oscillating output, wherein the fine digital tuning unit includes fine tuning elements and wherein each of the fine tuning elements comprises plate capacitors and one or more switches between the plate capacitors;
wherein the coarse digital tuning unit includes a plurality of coarse tuning elements, and wherein the coarse tuning elements include capacitors positioned between an inner coil element and an outer coil element of an inductor of the inductor-capacitor circuit.

31. The DCO of claim 30, wherein the one or more switches comprise at least three transistors.

32. The DCO of claim 31, wherein the fine digital tuning unit comprises a first plate capacitor, a second plate capacitor, a first transistor that couples the first plate capacitor to the second plate capacitor, a second transistor that couples the first plate capacitor to ground and a third transistor that couples the second plate capacitor to ground.

33. The DCO of claim 30, wherein the one or more switches comprise microelectromechanical (MEM) switches.

34. The DCO of claim 33, wherein the MEM switches includes at least three MEM switches.

35. A digitally controlled oscillator, comprising:
  means for adjusting an oscillating output of an inductor-capacitor circuit via a coarse digital tuning unit to provide coarse digital tuning of the oscillating output, wherein each coarse digital tuning unit includes a resistor between an inverter and a capacitor; and
  means for adjusting the oscillating output of the inductor-capacitor circuit via a fine digital tuning unit to provide fine digital tuning of the oscillating output, wherein the fine digital tuning unit includes fine tuning elements and wherein each of the fine tuning elements comprises plate capacitors and at least three transistors between the plate capacitors;
wherein the coarse digital tuning unit includes a plurality of coarse tuning elements, and wherein the coarse tuning elements include capacitors positioned between an inner coil element and an outer coil element of an inductor of the inductor-capacitor circuit.

* * * * *